(12) United States Patent
Yamada et al.

(10) Patent No.: US 6,239,490 B1
(45) Date of Patent: May 29, 2001

(54) P-CONTACT FOR A GROUP III-NITRIDE SEMICONDUCTOR DEVICE AND METHOD OF MAKING SAME

(75) Inventors: Norihide Yamada; Shigeru Nakagawa, both of Kokubunji; Yoshifumi Yamaoka; Tetsuya Takeuchi, both of Kawasaki; Yawara Kaneki, Kanagawa, all of (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/021,053

(22) Filed: Feb. 9, 1998

(30) Foreign Application Priority Data

Feb. 14, 1997 (JP) .................................... 9-030204

(51) Int. Cl.$^7$ ........................... H01L 23/48; H01L 23/52; H01L 29/40; H01L 21/28; H01L 21/3205

(52) U.S. Cl. ........................... 257/745; 257/741; 257/744; 438/604; 438/606

(58) Field of Search .................................... 257/741–745; 438/604, 606

(56) References Cited

U.S. PATENT DOCUMENTS

| | | | |
|---|---|---|---|
| 5,701,035 | * 12/1997 | Teraguchi | 257/747 |
| 5,776,623 | * 7/1998 | Hung et al. | 428/690 |
| 5,834,326 | * 11/1998 | Miyachi et al. | 438/29 |
| 5,923,690 | * 7/1999 | Kume et al. | 372/46 |

OTHER PUBLICATIONS

T. I. Kim, et al, "Wide Bandgap Semiconductor Laser–Challenges for the Future", Proceedings of SPIE, Feb. 10–13, 1997, pp. 88–100.

J. D. Guo, et al., "A Bilayer Ti/Ag Ohmic Contact for Highly Doped n–Type GaN Films", Applied Physics Letter, vol. 68, No. 2, Jan. 8, 1996, pp. 235–237.

M. Asif Khan, et al., "Violet–Blue GaN Homojunction Light Emitting Diodes with Rapid Thermal Annealed p–Type Layers", Applied Physics Letters, vol. 66, No. 16, Apr. 17, 1995, pp. 2046–2047.

R. J. Molnar, et al., "Blue–Violet Light Emitting Gallium Nitride p–n Junctions Grown by Electron Cyclotron Resonance–Assisted Molecular Beam Epitaxy", Applied Physics Letters, vol. 66, No. 3, Jan. 16, 1995, pp. 268–270.

M. E. Lin, "Low Resistance Ohmic Contacts on Wide Band–Gap Ga–N", Applied Physics Letters, vol. 64, No. 8, Feb. 21, 1994, pp. 1003–1004.

J. S. Foresi et al., "Metal Contacts on Gallium Nitride", Applied Physics Letters, vol. 62, No. 22, May 31, 1993, pp. 2859–2861.

Takao Miyajima et al., "Ti/Pt/Au Ohmic Contacts to n–Type ZnSe", Japan Journal of Applied Physics, vol. 31, Part 2, No. 12B, Dec. 15, 1992, pp. L1743–L1745.

Shuji Nakamura et al., "Hole Compensation Mechanism of P–Type GaN Films", Japan Journal of Applied Physics, vol. 31, Part 1, No. 5A, May 15, 1992, pp. 1258–1266.

A. T. Ping et al., "Characterization of Pd Schottky Barrier on n–Type GaN", Electronics Letters, vol. 32, No. 1, Jan. 4, 1996, pp. 68–70.

* cited by examiner

Primary Examiner—Eddie C. Lee
Assistant Examiner—Allan R. Wilson
(74) Attorney, Agent, or Firm—Ian Hardcastle

(57) ABSTRACT

A p-contact that comprises a contact layer of a p-type Group III-nitride semiconductor having an exposed surface and an electrode layer of palladium (Pd) located on the exposed surface of the contact layer. The p-contact is made by providing a p-type Group III-nitride semiconductor contact layer having an exposed surface, and depositing an electrode layer of palladium on the exposed surface of the contact layer. Preferably, the p-contact is annealed for a prolonged annealing time after the electrode layer is deposited, and the exposed surface of the contact layer is etched using hydrofluoric acid (HF) before depositing the electrode layer.

5 Claims, 1 Drawing Sheet

P-CONTACT FOR A GROUP III-NITRIDE SEMICONDUCTOR DEVICE AND METHOD OF MAKING SAME

FIELD OF THE INVENTION

The invention relates to a p-contact having a low contact resistance for making an electrical connections to p-type Group III-nitride semiconductor material and to a fabrication process for making a low-resistance p-contact that includes a Group III-nitride semiconductor material.

BACKGROUND OF THE INVENTION

A Group III-nitride semiconductor is a compound semiconductor containing a Group-III element and nitrogen. Group III-nitride semiconductors are promising materials for use in semiconductor devices including semiconductor light-emitting devices, such as laser diodes (LDs) and light-emitting diodes (LEDs), and metal-semiconductor field-effect transistors (MESFETs). In particular, laser diodes that use the Group III-nitride semiconductor gallium nitride (GaN) as their semiconductor material are known to be capable of remarkably improving the read and write capabilities of data storage devices. This is because GaN has a wide band-gap. Consequently, a laser diode based on GaN generates light at wavelengths in the blue-ultra violet range. Wavelengths in this range are short compared with those of light generated by conventional laser diodes that emit red or green light. For example, GaN-based blue-emitting laser diodes are being considered for use in high-capacity Digital Versatile Disks (DVDs) that will be introduced around the year 2000. Such DVDs are planned to have a capacity of about 15 gigabytes.

The lifetimes of current GaN-based laser diodes are short at the light intensities required for practical applications including the above-mentioned high-capacity DVDs. Currently-obtainable lifetimes will have to be substantially increased if GaN-based laser diodes are to have practical value. The major cause of the short lifetime of current GaN-based laser diodes is heat generated as a result of the high contact resistance of the electrical contacts to the GaN of the device. The high contact resistance is a consequence of the large band-gap of GaN. The band gap of GaN is 3.4 eV, which is higher than that of most other semiconductors used for making electronic devices.

FIG. 1 shows an example of a GaN-based edge-emitting laser. The laser 1 is formed by depositing the GaN buffer layer 3 on the sapphire substrate 2 and then successively depositing the n-type GaN contact layer 4, the n-type AlGaN cladding layer 6, the n-type GaN layer 7, the InGaN multi-quantum well layer 8, the p-type GaN layer 9, the p-type AlGaN cladding layer 10, and the p-type GaN contact layer 11. The n-electrode 5 together with the n-type GaN contact layer 4 collectively form the n-contact 13, and the p-electrode 12 together with the p-type GaN contact layer 11 collectively form the p-contact 14. The exposed surfaces of the device are passivated by the $SiO_2$ layer 15.

The contact resistance of the n-contact 13 composed of the n-type GaN contact layer 4 and the n-electrode 5 is fairly low. However, the contact resistance of the p-contact 14 between the p-type GaN contact layer 11 and the p-contact electrode 12 is much higher than that of the n-contact. For example, the sheet contact resistivity of the p-contact of a typical device having Au/Ni electrodes is about $2 \times 10^{-1}$ $\Omega cm^2$. If the electrode contact area is 300 $\mu m \times 300$ $\mu m$, the contact resistance of the p-contact is greater than 200 $\Omega$. Consequently, a drive current of 100 mA will generate more than 2 W in the p-contact.

NIKKEI ELECTRONICS No. 671, p.9, (Sep. 23, 1996), (Nikkei McGraw-Hill Co.) describes a laser diode that has a light-emitting layer having an InGaN multi-quantum well structure composed of 25 quantum wells. A drive voltage of 20 V and a drive current of 5A, corresponding to a power of 100W, is required to cause this device to emit violet light at a wavelength of 417 nm. Since the laser diode is incapable of continuously dissipating this amount of power, it cannot be operated continuously. Instead, it must be operated in a pulse mode with a duty cycle of about 0.001. This corresponds to an average power of 100 mW.

In other applications, contact resistance of the order just described increases series resistance, increases power consumption, increases the operating temperature of the device, degrades the operating efficiency of the device, and shortens the lifetime of the device. What is needed is a reduction in the contact resistance of the metal-to-semiconductor contact to a level that can be ignored compared to the bulk series resistance of the semiconductor device.

The contact resistance $R_c$ of a metal-to-semiconductor contact can be used as a performance index for the contact. Since the contact resistance $R_c$ depends exponentially on the effective barrier height $\phi_B$ between the metal electrode and the semiconductor material, a way of reducing the effective barrier height $\phi_B$ is required. Moreover, in a semiconductor having a high carrier concentration N, where the tunnelling current is dominant, since the contact resistance $R_c$ depends exponentially on the term $\phi_B N^{-\frac{1}{2}}$, the contact resistance can be reduced by increasing the dopant concentration N.

The above-mentioned NIKKI ELECTRONICS article describes one conventional technology in which the p-GaN carrier concentration is increased to more more than $10^{19}$ $cm^{-3}$. However, this technique lead to a marked decrease in the acceptor activation rate and produces an extreme degradation of crystallinity. Consequently, this technique does not produce favorable results.

In *Electrical Characteristics and Interface Structure of an Ni/Au Contact on P-type GaN*, PROC. OF THE 42ND CONFERENCE OF THE JAPANESE SOCIETY OF APPLIED PHYSICS, Lecture No. 30a-ZH-8, 1995 (Spring 1995), Kobayashi et al. describe a process in which GaN:Mg is activated at a high temperature of about 800° C. until the hole carrier concentration reaches in the range 4 to $8 \times 10^{17}$ $cm^{-3}$. GaN:Mg is GaN doped with magnesium (Mg). Then, gold/nickel metal electrodes are deposited and annealed. This produces a p-contact with a sheet contact resistivity reduced to $10^{-2}$ $\Omega cm^2$. However, this value is still insufficiently low.

Some conventional devices in which an electrical connection is made to a p-type Group III-nitride semiconductor a nickel electrode directly deposited on the p-type Group III-nitride semiconductor. Nickel is deposited on the exposed surface of the p-type semiconductor and is then annealed at a temperature above its eutectic point for a relatively short time. One or two minutes is typical. However, using nickel as the electrode material of a p-contact for a Group III-nitride semiconductor results in the p-contact having high resistance and a large voltage drop across the p-contact with the LED or LD incorporating such p-contact is driven. Consequently, although a Group III-nitride semiconductor-based light-emitting device that will radiate the desired luminous intensity can be made using nickel as the material of the electrode of the p-contact, such a device requires a high drive voltage, and an excessive amount of heat is generated at the p-contact. Such a light-emitting device has to be fitted with a heat sink to dissipate this heat. Moreover, the amount of heat generated by the resistance of the p-contact prevents the light-emitting device from being operated continuously, and impairs the service life and reliability of the device.

Other metals often used as the electrode material of the p-contact of Group III-nitride based light-emitting devices include gold (Au), platinum (Pt), nickel (Ni), and iridium (Ir), but acceptable results are not obtained using these metals.

If a low resistance p-contact for GaN could be fabricated inexpensively and with excellent reliability, it is likely that such a p-contact could also be used in many other semiconductor devices in which an electrical connection must be made to a p-type Group III-nitride semiconductor. Therefore, what is needed is low-resistance p-contact for p-type Group III-nitride semiconductors and a simple way of making such a p-contact. The p-contact should be usable in light-emitting devices, such as LEDs and LDs, based on Group III-nitride semiconductors, and should provide such devices with a low drive voltage, high efficiency, high reliability, and a long service life.

SUMMARY OF THE INVENTION

The invention provides a p-contact for a Group III-nitride semiconductor device. The p-contact comprises a contact layer of a p-type Group III-nitride semiconductor having an exposed surface and an electrode layer of palladium (Pd) located on the exposed surface of the contact layer.

The invention also provides a method of making a p-contact for a Group III-nitride semiconductor. In the method, a p-type Group III-nitride semiconductor contact layer having an exposed surface is provided, and an electrode layer of palladium is deposited on the exposed surface of the contact layer.

The method may additionally comprise annealing the p-contact for a prolonged annealing time after the electrode layer is deposited.

The method may additionally comprise etching the exposed surface of the contact layer using hydrofluoric acid (HF) before depositing the electrode layer.

DETAILED DESCRIPTION OF THE INVENTION

The invention provides a low-resistance p-contact for p-type Group III-nitride semiconductors. The p-contact according to the invention is composed of a layer of palladium located on the surface of the p-type Group III-nitride semiconductor that has been cleaned using hydrofluoric acid. The p-contact according to the invention is made by cleaning the surface of the Group III-nitride semiconductor using hydrofluoric acid before the layer of palladium is deposited. After the layer of palladium is deposited, it is annealed for an annealing time that is of the order of one hour. This annealing time is an order of magnitude greater than conventional annealing times. The p-contact according to the invention provides a significant reduction in resistance compared with conventional p-contacts for Group III-nitride semiconductors.

In this disclosure, a GaN material is a Group III-nitride semiconductor with gallium nitride as its primary component, such as GaN, InGaN, or AlGaN, and may also include zinc (Zn), silicon (Si), magnesium (Mg) or other element as a dopant. In the example that will be described next, the GaN material is GaN doped with various dopants. The p-contact according to the invention will be described with reference to an LED fabricated from various GaN materials. However, the p-contact according to the invention may be used in any semiconductor device in which an electrical contact is to be made to a p-type Group III-nitride semiconductor.

Figure 1:
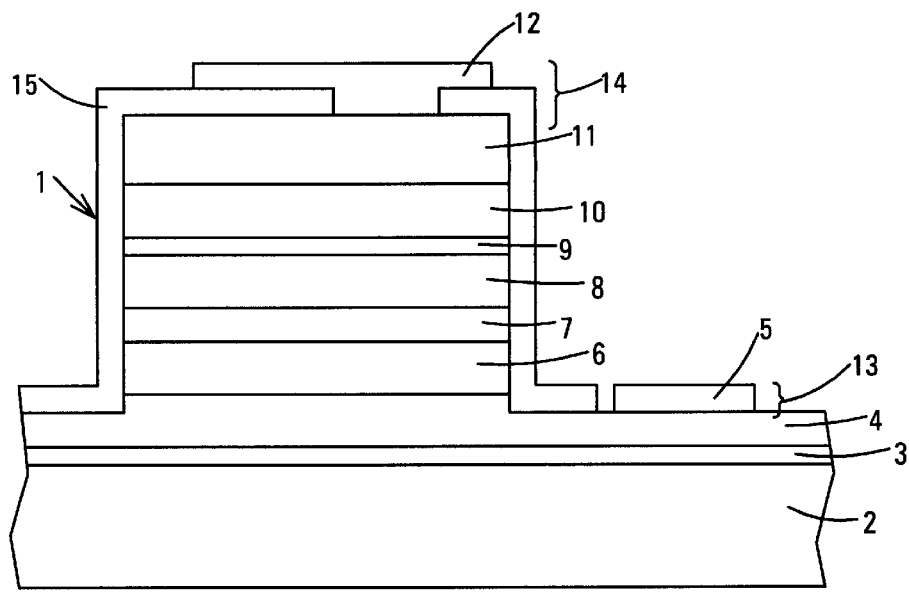
FIG. 1 is a cross-sectional view of a conventional edge-emitting laser based on Group III-nitride semiconductors.
Figure 2:
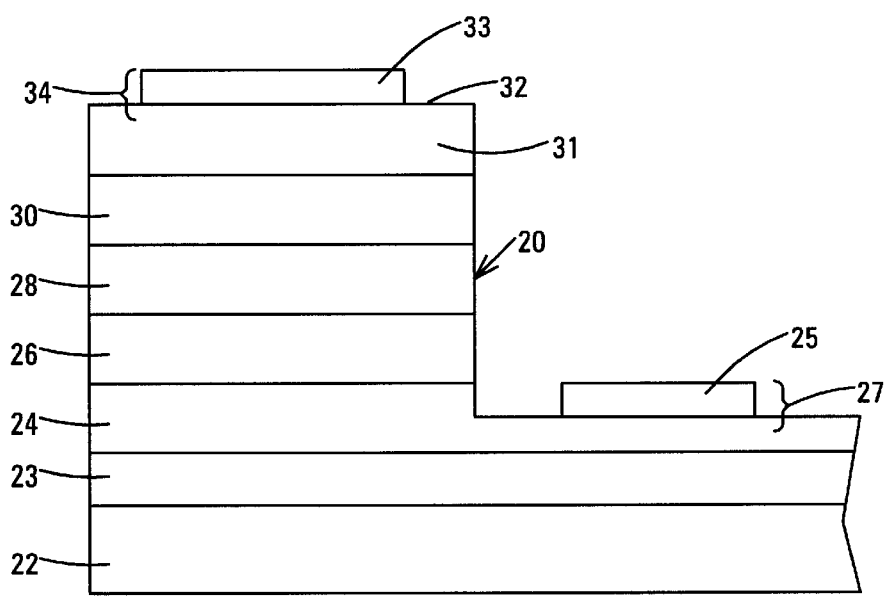
FIG. 2 is a schematic cross-sectional view of a Group III-nitride semiconductor-based LED that includes the p-contact according to the invention.

FIG. 2 is a schematic cross-sectional view of the Group III-nitride semiconductor-based LED 20 that incorporates the p-contact according to the invention. The LED 20 is fabricated from various GaN materials by a process in which the AlN buffer layer 23, the n-type GaN contact layer 24, the n-type AlGaN cladding layer 26, the InGaN active layer 28, the p-type AlGaN cladding layer 30 and the p-type contact layer 31 are sequentially deposited on the sapphire substrate 22. The GaN of the p-type contact layer is doped with a suitable acceptor impurity, for example, magnesium. Processes to form the structure just described are known in the art and so will not be described here since this disclosure principally relates to the low-resistance p-contact that makes electrical contact to the p-type GaN contact layer 31, and the process for making such a p-contact.

The n-electrode 25 is deposited on the n-type GaN contact layer 24 to form the n-contact 27. The method of the invention is used to deposit the palladium p-electrode 33 on the cleaned surface 32 of the p-type GaN contact layer 31 to form the p-contact 34 according to the invention.

In the process for making the p-contact, the surface of the GaN contact layer is cleaned using an HF-based etchant, the p-electrode is deposited on the clean, exposed surface of the contact layer, and the electrode is annealed for a prolonged annealing time to form the p-contact. The structure of the p-contact will be described in more detail first. Then the process for making the p-contact will be described in more detail.

Figure 3:
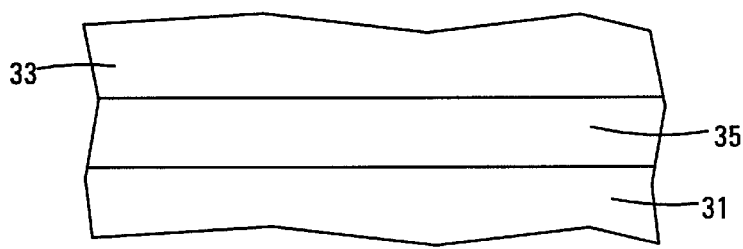
FIG. 3 is a cross-sectional view showing part of the p-contact according to the invention in more detail.

FIG. 3 shows a cross-sectional view part of the p-contact 34 of the LED shown in FIG. 2 after the layer of palladium has been deposited directly on the clean, exposed surface 32 of the p-type GaN-material contact layer 31 to form the electrode 33. The thickness of the palladium layer should be at least 0.1 nm. In the preferred embodiment, the thickness was 200 nm. FIG. 3 shows the alloy region 35 that forms between the Pd p-electrode 33 and the p-GaN contact layer 31 as a result of the prolonged annealing process to which the p-contact is subject, as will be described below. The thickness of the alloy region is commensurate with the prolonged annealing time, and is therefore substantially thicker than any alloy region that may be formed in a conventional p-contact. The region of the p-contact on both sides of the surface 32 also differs from the corresponding region of a conventional p-contact in that it is substantially devoid of oxygen, due to the efficacy of the etching process chosen by the inventors to clean the surface 32.

The process according to the invention for making the p-contact according to the invention will now be described.

Surface Cleaning

Conventional cleaning methods for GaAs semiconductors or In semiconductors etch the surface to be cleaned using sulphuric acid or ammonia as an etchant. However, these etchants are ineffective for cleaning the surface of Group III-nitride semiconductors due to the low reactivity of such semiconductors. Since the cleanliness of the surface 32 of the p-GaN contact layer 31 plays an important role in reducing the resistance of an electrical contact made to this contact layer, an etchant capable of effectively cleaning the surface of the Group III-nitride semiconductor must be found. The inventors have discovered that hydrofluoric acid (HF) is capable of etching the surface of p-type GaN material in a way that provides the required degree of cleanliness. An example of a process using HF for cleaning the surface of a p-type GaN-material will now be described.

The wafer having an exposed surface of a p-type GaN material is dipped in boiling trichloroethylene solvent for about 3 minutes. The wafer is then dipped in aqua regia maintained at about 20° C. for about 5 minutes. The wafer is next rinsed with distilled water maintained at about 20° C. The wafer is dipped in HF maintained at about 27° C. for about 10 minutes. The wafer is rinsed with distilled water maintained at about 20° C. Finally, the wafer is dried for about 15 minutes in dry nitrogen maintained at about 110° C.

The conditions set forth above are not rigid, and some variation within an allowable range is possible.

Electrode Formation

In this embodiment, palladium was selected as the material of the p-electrode 33 of the p-contact 34 due its substantially larger work function than the conventionally-used electrode materials. After the surface cleaning process described above, the wafer is transferred to a vacuum chamber. The wafer is maintained at about room temperature and a 200 nm-thick layer of palladium is deposited on the exposed surface of the wafer using electron beam evaporation (EBE). The pressure in the vacuum chamber was maintained at about $2 \times 10^{-6}$ torr, and the preferred deposition rate was 0.5 nm/s.

Alternatively, a 100 nm-thick layer of palladium may be deposited on the exposed, clean surface 32 of the p-GaN contact layer 31 and a 100 nm-thick layer of platinum may be deposited on the layer of palladium to form the electrode 33. In this case, the deposition rates were 2 nm/s for the palladium layer and 0.5 nm/s for the platinum layer. A gold layer may be added on top of the platinum layer. The layer of platinum or the layers of platinum and gold reduce the electrical resistance of the electrode itself, and prevent the palladium oxidizing.

Annealing

As noted above, the p-contact of a Group III-nitride semiconductor-based LED or an LD has conventionally been formed by depositing a metal, such as nickel, on the surface of the semiconductor material as the material of the electrode, and then annealing the electrode at a temperature above the eutectic point of the electrode material. This brief annealing process forms a metal-semiconductor alloy at the metal-semiconductor interface, and a large quantity of the metal atoms dope the recrystallized semiconductor. This conventional process forms a stable, but high-resistance ohmic contact with a Group III-nitride semiconductor material.

In the first embodiment of the invention, the palladium layer is also annealed after it has been deposited, but the annealing is performed for a longer time than has been used for conventional annealing, and is performed in a dry nitrogen atmosphere. The inventor believe that the extended annealing time causes the deposited palladium to diffuse deep into the Group III-nitride material. The inventors believe that this effect, together with the high work function of palladium, gives rise to the excellent contact resistance of the p-contact according to the invention.

The p-contact is annealed at a temperature in the range between about 450° C. and about 550° C. As the annealing process progresses, the contact resistance of the p-contact diminishes towards a minimum and then increases. The preferred annealing time is in the range between about 20 minutes to about 60 minutes. Finally, a bonding wire (not shown) is bonded to the palladium electrode 33 in a conventional way.

Example

The advantage of a palladium electrode over a conventional electrode and the advantage of a prolonged annealing time was demonstrated as follows. A p-contact according to the invention was made by cleaning the surface of a GaN material with HF as described above, depositing a layer of palladium on the exposed, clean surface of the GaN material, and then annealing the wafer for about 60 minutes. A p-contact having nickel as the electrode material was made for comparison by cleaning the surface of a layer of GaN material with HF according to the invention, depositing a layer of nickel on the clean, exposed surface of the GaN material, and then annealing the wafer for 1 to 2 minutes.

To determine the effect of using palladium with a long annealing time instead of nickel with a short annealing time in a p-contact, the electrodes made as just described were shaped to enable contact resistance measurements to be made using the transmission line model method. The measured sheet contact resistivity of the p-contact using the nickel electrode was $1 \times 10^{-1}$ $\Omega cm^2$, and that of the p-contact according to the invention having the palladium electrode was about $5 \times 10^{-3}$ $\Omega cm^2$. In other words, using palladium and a long annealing time reduced the sheet contact resistivity of the p-contact by a factor of about 20.

A p-contact according to the invention was made using the method according to the invention on the GaN material-based LED shown in FIG. 2. A p-contact in which nickel was deposited instead of palladium and a short annealing time was used, was formed on an identical GaN-based LED for comparison purposes. A current of 20 mA was driven though each LED to cause the LED to emit light, and the voltage drop across each LED was measured. The voltage across the LED having the nickel p-contact was about 4.2 V, whereas the voltage across the LED having the p-contact according to the invention with the palladium electrode was 3.39 V.

The p-contact according to the invention enables a device including a p-type Group III-nitride semiconductor to be driven more efficiently since it reduces the voltage required to drive a given current through the device. Moreover, the power required to drive the device is reduced, which increases the efficiency of the device. The p-contact according to the invention also increases the reliability and service life of a Group III-nitride semiconductor device that uses it. Lowering the contact resistance of the p-contact for a Group-III nitride semiconductor reduces the heat generated when the semiconductor device is operated. This reduces the operating temperature of the semiconductor device, which increases the reliability and service life. Finally, the p-contact according to the invention increases the efficiency, reliability and service life of a light-emitting device, such as a light-emitting diode or laser diode, that incorporates the p-contact.

Although this disclosure describes illustrative embodiments of the invention in detail, it is to be understood that the invention is not limited to the precise embodiments described, and that various modifications may be practiced within the scope of the invention defined by the appended claims.

We claim:

1. A p-contact for a Group III-nitride semiconductor device, the p-contact comprising:
- a contact layer of a p-type Group III-nitride semiconductor having an exposed surface;
- an electrode layer of palladium (Pd) located on the exposed surface of the contact layer; and
- an alloy layer including a palladium/Group III-nitride semiconductor alloy extending into the contact layer from the exposed surface, in which:
- the p-contact is devoid of oxygen atoms at least in a region extending into the contact layer from a portion of the exposed surface on which the electrode layer is located.

2. The p-contact of claim 1, in which the contact layer includes a GaN semiconductor.

3. The p-contact of claim 2, in which the electrode layer has a thickness of at least 0.1 nm.

4. The p-contact of claim 1, in which the electrode layer has a thickness of at least 0.1 nm.

5. The p-contact of claim 1, in which the alloy layer has a thickness commensurate with annealing at about 500° C. for about one hour.

* * * * *